US009502615B2

(12) United States Patent
Wang et al.

(10) Patent No.: US 9,502,615 B2
(45) Date of Patent: Nov. 22, 2016

(54) LIGHT-EMITTING DIODE DEVICE

(71) Applicant: Epistar Corporation, Hsinchu (TW)

(72) Inventors: Hsin-Ying Wang, Hsinchu (TW);
De-Shan Kuo, Hsinchu (TW);
Wen-Hung Chuang, Hsinchu (TW);
Tsun-Kai Ko, Hsinchu (TW);
Chia-Chen Tsai, Hsinchu (TW);
Chyi-Yang Sheu, Hsinchu (TW);
Chun-Chang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/939,829

(22) Filed: Nov. 12, 2015

(65) Prior Publication Data

US 2016/0141454 A1 May 19, 2016

Related U.S. Application Data

(60) Provisional application No. 62/079,453, filed on Nov. 13, 2014.

(51) Int. Cl.
*H01L 33/00* (2010.01)
*H01L 33/38* (2010.01)
*H01L 33/20* (2010.01)

(52) U.S. Cl.
CPC ............... *H01L 33/38* (2013.01); *H01L 33/20* (2013.01)

(58) Field of Classification Search
None
See application file for complete search history.

(56) References Cited

U.S. PATENT DOCUMENTS

| 7,550,775 | B2 * | 6/2009 | Okuyama | H01L 33/20 257/94 |
| 8,629,424 | B2 * | 1/2014 | Zhu | H01L 33/06 257/13 |
| 8,729,580 | B2 * | 5/2014 | Lester | H01L 33/44 257/100 |
| 2002/0096994 | A1 * | 7/2002 | Iwafuchi | H01L 21/2007 313/495 |
| 2002/0171089 | A1 * | 11/2002 | Okuyama | H01L 27/156 257/88 |
| 2012/0164797 | A1 * | 6/2012 | Lowenthal | H01L 27/3281 438/127 |
| 2016/0141454 | A1 * | 5/2016 | Wang | H01L 33/24 257/13 |

* cited by examiner

*Primary Examiner* — Thao P Le
(74) *Attorney, Agent, or Firm* — Muncy, Geissler, Olds & Lowe, P.C.

(57) ABSTRACT

A light-emitting element, includes a substrate; a first light-emitting stack formed on the substrate, including a triangular upper surface parallel to the substrate, and wherein the triangular upper surface has three sides and three vertexes; a first electrode formed on the first light-emitting stack and located near a first side of the three sides of the triangular upper surface; and a second electrode formed on the first light-emitting stack; including a second electrode pad near a first vertex of the three vertexes; and a second electrode extending part extending from the second electrode pad in two directions, disposed along other two sides of the three sides to surround the first electrode and stopping at the first side to form an opening.

20 Claims, 12 Drawing Sheets

LIGHT-EMITTING DIODE DEVICE

CROSS-REFERENCE TO RELATED APPLICATIONS

This application claims the benefit of U.S. provisional application No. 62/079,453 filed on Nov. 13, 2014, and the content of which is incorporated by reference in its entirety.

BACKGROUND

1. Technical Field

The present disclosure relates to a light-emitting device, more particularly, to a light-emitting device with improved brightness.

2. Description of the Related Art

The light-emitting diodes (LEDs) of the solid-state lighting elements have the characteristics of low power consumption, low heat generation, long operation life, crash proof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

A conventional LED basically includes a substrate, an n-type semiconductor layer, an active layer and a p-type semiconductor layer formed on the substrate, and p/n electrodes respectively formed on the p-type/n-type semiconductor layers. When imposing a certain level of forward voltage to the LED via the electrodes, holes from the p-type semiconductor layer and electrons from the n-type semiconductor layer are combined in the active layer to release light. However, the electrodes shelter light emitted from the active layer, and current may be crowded in semiconductor layers near the electrodes. Thus, an optimized electrode structure is needed for improving brightness, optical field uniformity and lowering an operating voltage of the LED.

Besides, the conventional LED has a quadrangular shape. The substrate has sidewalls forming four 90° interior angles. An internal reflection of light inside the quadrangular LED may easily occur due to this kind of LED shape so that the light may hardly escape from the LED. As a result, light extraction and brightness of the LED deteriorate.

SUMMARY OF THE DISCLOSURE

A light-emitting element, includes a substrate; a first light-emitting stack formed on the substrate, including a triangular upper surface parallel to the substrate, having three sides and three vertexes; a first electrode formed on the first light-emitting stack and located near a first side of the three sides of the triangular upper surface; and a second electrode formed on the first light-emitting stack; including a second electrode pad near a first vertex of the three vertexes; and a second electrode extending part extending from the second electrode pad in two directions, disposed along other two sides of the three sides to surround the first electrode and stopping at the first side to form an opening.

A light-emitting element, includes a substrate; a light-emitting stack formed on the substrate, including a triangular upper surface parallel to the substrate, having three sides and three vertexes; a first electrode formed on the light-emitting stack and located within an inscribed circle of the triangular upper surface; and a second electrode formed on the light-emitting stack; including a second electrode pad near a first vertex of the three vertexes; a second electrode extending part extending from the second electrode pad, disposed along the three sides and having a closed loop to enclose the first electrode therein.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1A:
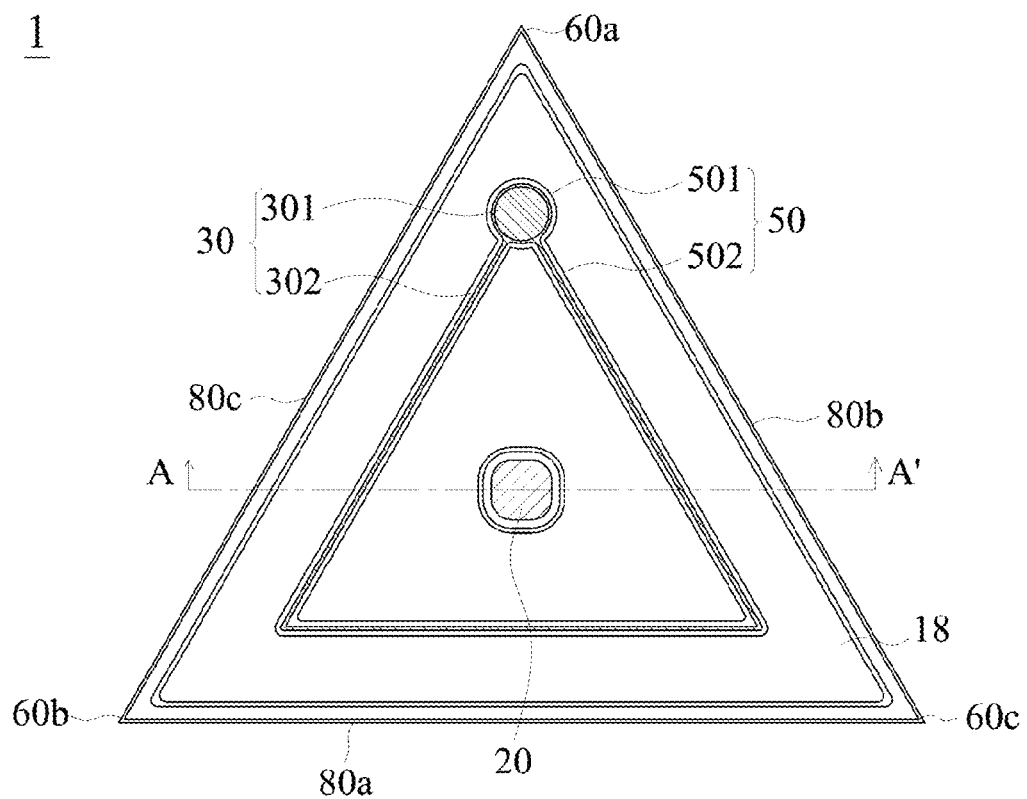
FIG. 1A is a top view of a light-emitting device in accordance with one embodiment of present disclosure.
Figure 1B:
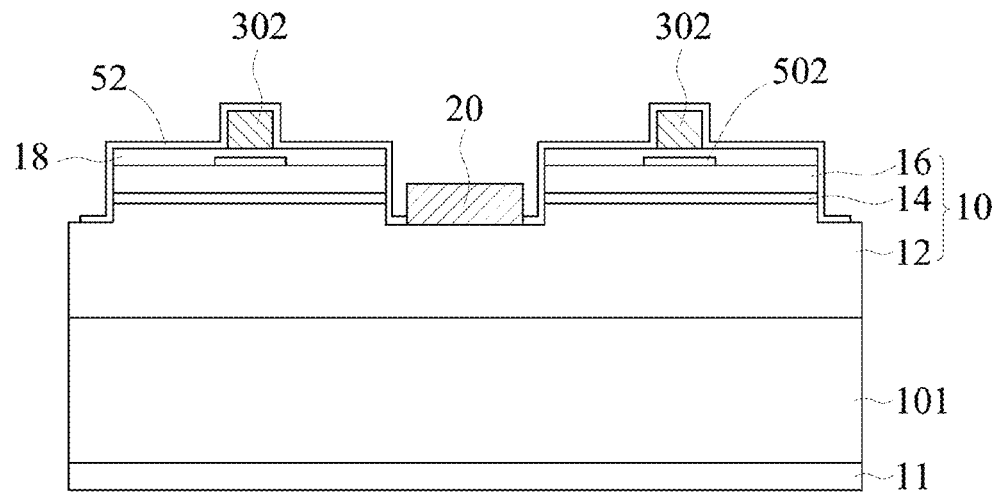
FIG. 1B is a cross-sectional view of a light-emitting device disclosed in FIG. 1A.

FIG. 1A shows a top view of a light-emitting device 1 in accordance with an embodiment of the present disclosure. FIG. 1B shows a cross-sectional view taken along A-A' line of the light-emitting device 1 in FIG. 1A. As shown in FIG. 1A and FIG. 1B, the light-emitting device 1 includes a substrate 101 and a light-emitting stack 10 formed thereon. The light-emitting stack 10 includes a first conductivity type semiconductor layer 12 for example an n-type semiconductor layer 12, an active layer 14, and a second conductivity type semiconductor layer 16 for example a p-type semiconductor layer 16 sequentially formed on one side of the substrate 101. A transparent conductive layer 18 is formed on the p-type semiconductor layer 16. A first electrode 20 is formed on the n-type semiconductor layer 12 and a second electrode 30 including a second pad 301 and a second extending electrode 302 is formed on the p-type semiconductor layer. A current blocking layer 50 including a first part 501 and a second part 502 is formed under the second pad 301 and a second extending electrode 302 respectively and has a similar shape with the second electrode 30. A passivation layer 52 used to protect the light-emitting stack 10 covers an upper surface of the light-emitting device 1 and second extending electrode 302, and exposes the first electrode 20 and the second pad 301. A reflector 11 is formed on a surface of the substrate 101 opposite the light-emitting stack 10 to reflect lights emitted from the light-emitting stack 10. The material of the reflector 11 can be metal. The reflector 11 can also be a distributed Bragg reflector (DBR) formed by alternately stacking two or more layers with different refractive indexes. The distributed Bragg reflector can be insulating material or conductive material. The reflector 11 can also be an omnidirectional reflector (ODR) formed by dielectric layers and metal layers. The dielectric layer can be insulating material or conductive material. The insulating material comprises polyimide, BCB, PFOB, MgO, SUB, epoxy, acrylic resin, COC, PMMA, PET, PC, polyetherimide, fluorocarbon polymer, silicone, glass, $Al_2O_3$, $SiO_x$, $TiO_2$, $SiN_x$, SOG, or TOES. The conductive material comprises ITO, InO, SnO, CTO, ATO, AZO, ZTO, GZO, AlGaAs, GaN, GaP, or IZO. The metal layer comprises Al, Ag, Au, or Rh.

The material of the n-type semiconductor layer 12, the active layer 14 and the p-type semiconductor layer 16 can be material which includes one or more than one element selected form Ga, Al, In, P, N, Zn, Cd or Se. In this embodiment, the material includes GaN based material. The material of p-type semiconductor layer 16 includes $Al_{x1}Ga_{y1}In_{(1-x1-y1)}N$ ($0 \le x1$, $y1 \le 1$). The material of n-type semiconductor layer 12 includes $Al_{x2}Ga_{y2}In_{(1-x2-y2)}N$ ($0 \le x2$, $y2 \le 1$). The material of active layer 14 includes $Al_{x3}Ga_{y3}In_{(1-x3-y3)}N$ ($0 \le x3$, $y3 \le 1$). The active layer 14 includes InGaN based material can emit blue light with wavelength between 450 nm and 490 nm. The active layer 14 includes AlGaN based material can emit UV light with wavelength between 250 nm and 400 nm. In another embodiment, the p-type semiconductor layer 16 has a textured upper surface in order to suppress total internal reflection so as to improve luminous efficiency of the light-emitting device. Moreover, the active layer 14 emits one or more than one color light. The light can be visible such green or blue light or invisible such as UVA, UVB or UVC. The structure of the active layer 14 can be single heterostructure (SH), double heterostructure (DH), double-side double heterostructure (DDH), multi-quantum well (MQW) or quantum dot. The transparent conductive layer 18 improves electrically contact between the semiconductor layer and the second electrode 30 as well as current spreading. The transparent conductive layer 18 is transparent to light emitted from light-emitting stack 10. The material of the transparent conductive layer 18 can be conductive material which includes but is not limited to ITO, InO, SnO, CTO, ATO, AZO, ZTO, GZO, ZnO, MgO, AlGaAs, GaN, GaP or IZO. The substrate 101 supports the light-emitting stack 10 and other layers or other structure which disposed thereon. The material of the substrate 10 includes a transparent substrate or an electrically conductive substrate. The material of the transparent substrate includes but is not limited to sapphire, diamond, glass, epoxy, quartz, acryl, $Al_2O_3$, $Ga_2O_3$, ZnO, GaN, AlN or GaP, etc. The material of the electrically conductive substrate can be Cu, Al, Mo, Sn, Zn, Cd, Ni, Co, CuW, diamond like Carbon (DLC), Graphite, carbon fiber, metal matrix composite (MMC), ceramic matrix composite (CMC), MCPCB, Si, Ge, AlN, GaN, ZnSe, GaAs, SiC, GaP, GaAsP, InP, $Ga_2O_3$, $LiGaO_2$ or $LiAlO_2$. Among these materials, sapphire, GaAs, SiC, AlN, GaN, $Ga_2O_3$, diamond, Ge and Si can be used as a growth substrate. The substrate 101 optionally has a patterned upper surface which can improve epitaxy quality and light extraction via scattering the light emitted from the light-emitting stack 10.

As shown in FIG. 1A and FIG. 1B, the light-emitting device 1 includes a triangular substrate 101 and the light-emitting stack 10 formed thereon so that an upper surface of the light-emitting device 1 has a triangular shape. The light extraction at lateral sidewalls of the triangular substrate is more effective than that of a conventional rectangular substrate. The triangular shape includes a first side 80a, a second side 80b and a third side 80c. In an inner area or a central area of the triangular shape, parts of the p-type semiconductor layer 16 and the active layer 14 are etched away to expose a portion of the n-type semiconductor layer 12. The first electrode 20 is formed on the exposed n-type semiconductor layer 12 and electrically connected to the n-type semiconductor layer 12. The first electrode 20 is located in the inner area or a central area of the triangular shape in the top view. In one embodiment, the central area indicates the area within an inscribed circle of the triangular shape. In this embodiment, the triangular shape is a regular triangle and the first electrode 20 is formed at the geometric center of the regular triangle. However, the presented application is not limited to the regular triangle, it will be apparent to those skill in the art that modifications and variations could be made without departing from the spirit and the scope of the presented disclosure. The second pad 301 of the second electrode 30 is located adjacent to one vertex 60a of the triangular shape and the second extending electrode 302 extends from the second pad 301. The second extending electrode 302 is formed along the sides 80a~80c and parallels to the sides 80a~80c of the triangular shape so as to surrounds the first electrode 20. The current spread from the second pad 301 and the second extending electrode 302 flows to the first electrode 20 in omnidirection. Therefore, the current spreading is more uniform so that current conductivity as well as the luminous efficiency of the light-emitting device 1 is improved. In this embodiment, the second extending electrode 302 forms an enclosed structure to encircle the first electrode 20 therein. In a preferable embodiment, the distance between the second extending electrode 302 and the first electrode 20 is 80 µm to 150 µm. The shape of the second pad 301 can be a circle or a polygon.

Figure 1C:
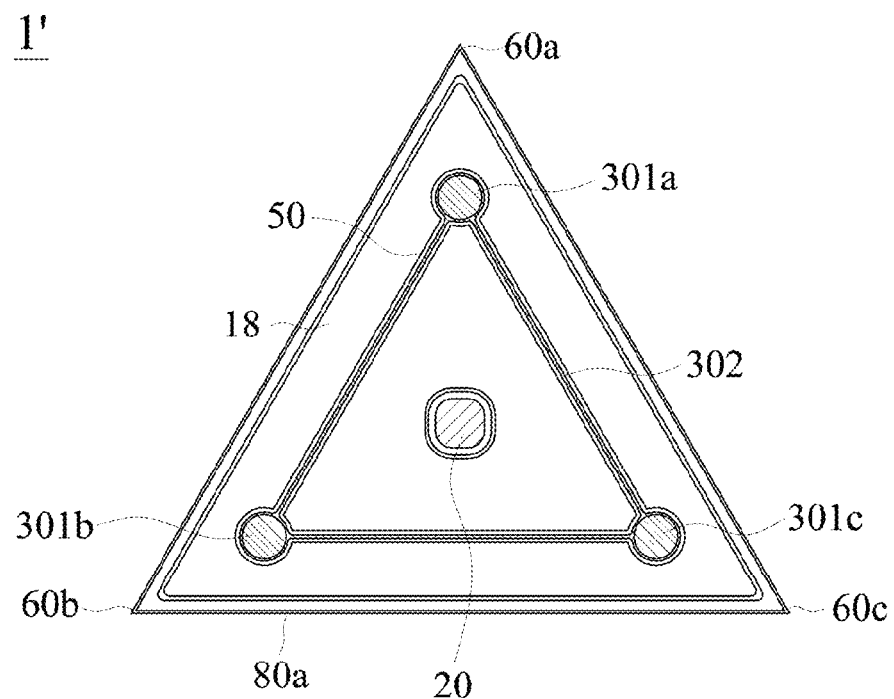
FIG. 1C is a top view of a light-emitting device in accordance with another embodiment of present disclosure.
Figure 1D:
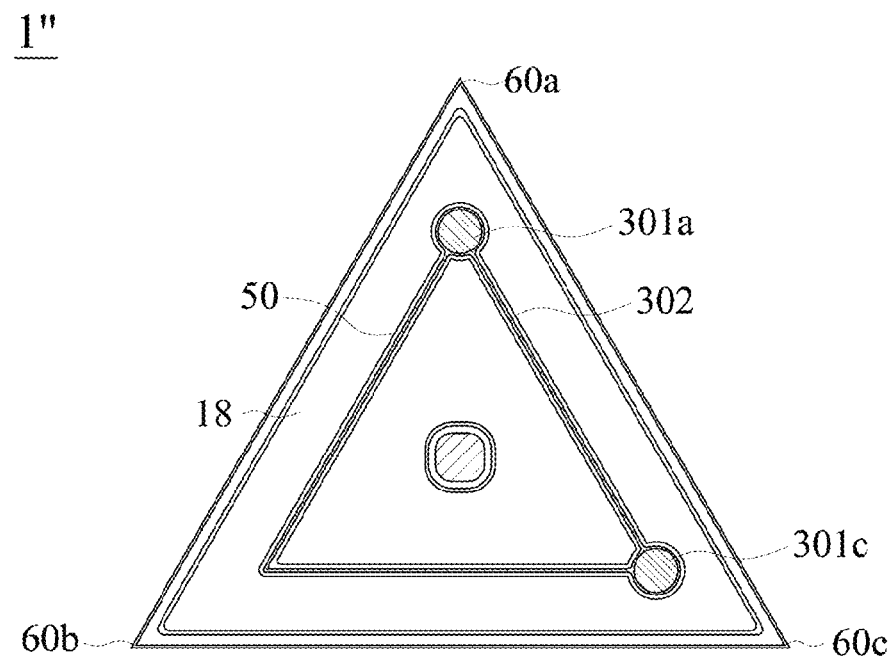
FIG. 1D is a top view of a light-emitting device in accordance with another embodiment of present disclosure.

FIG. 1C shows a top view of a light-emitting device 1' in accordance with another embodiment. The cross-sectional structure of the light-emitting device 1' is similar to that of the light-emitting device 1 shown in FIG. 1B, the difference is that in FIG. 1C, the second electrode 30 includes a plurality of second pads 301a, 301b, and 301c respectively located adjacent to the vertexes 60a, 60b, and 60c of the triangular shape. The second electrode pads 301a, 301b, 301c and the second extending electrode 302 enclose the first electrode 20. The first electrode 20 and the second pads 301a, 301b, 301c are used to receive external current for driving the light-emitting device 1'. As the three second pads 301a, 301b, 301c are disposed adjacent to the three vertexes 60a, 60b, 60c, the layout of the electrodes is symmetrical. Besides, since currents flow into the light-emitting device 1' via the plurality of the second pads 301a, 301b, 301c respectively, the current spreading is more uniform and the forward voltage of the light-emitting device is reduced. However, in these embodiments, the number of the second pads is not limited to three. FIG. 1D shows a top view of a light-emitting device 1" in accordance with another embodiment. Two second pads 301a, 301c located adjacent to two of the vertexes 60a, 60c as shown in FIG. 1D can also be applied.

Figure 2A:
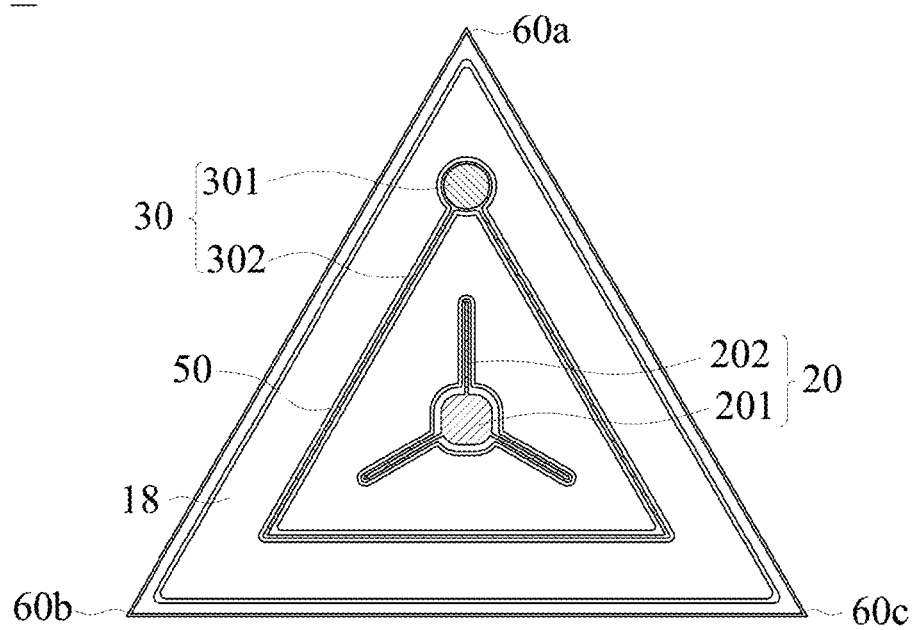
FIGS. 2A-2C are top views of light-emitting devices in accordance with another embodiments of present disclosure.
Figure 2B:
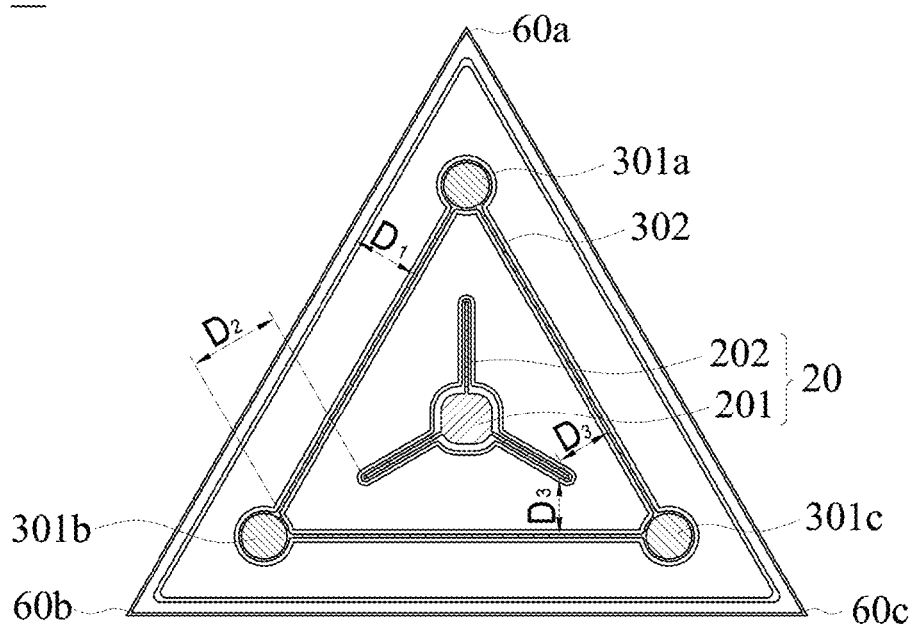
Figure 2C:
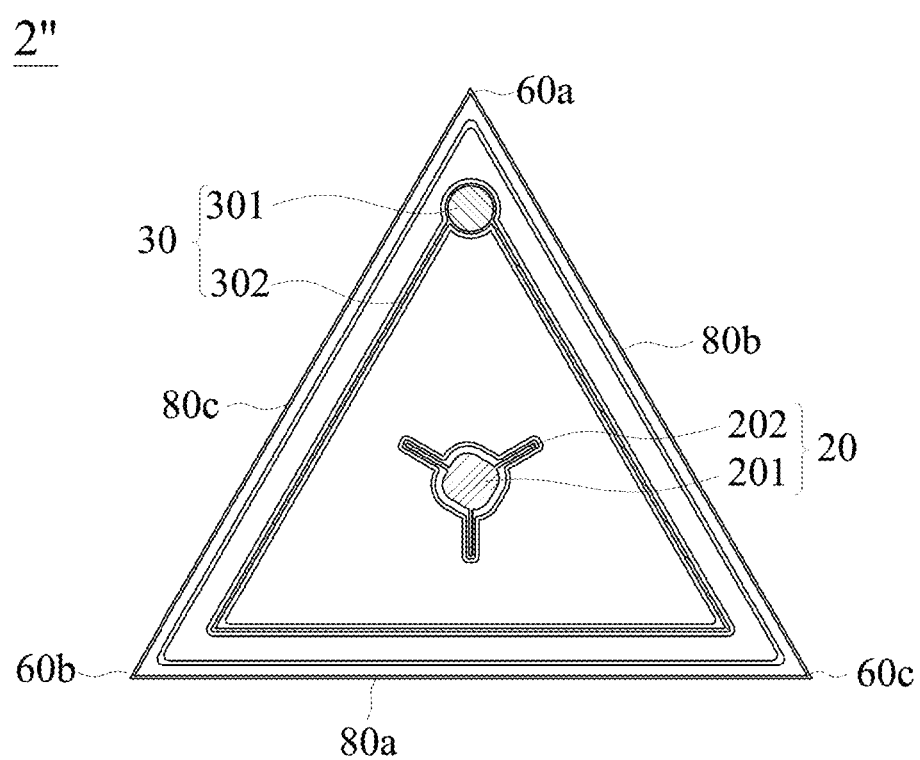

FIG. 2A shows a top view of a light-emitting device 2 in accordance with another embodiment. The structure of the light-emitting device 2 in FIG. 2A is similar to the structure described in FIGS. 1A~1C. The difference is that in FIG. 2A, the first electrode 20 includes a first pad 201 and a plurality of first extending electrodes 202 linearly extending from the first pad 201 toward the vertexes 60a, 60b, and 60c of the triangular shape. That is, the first extending electrodes 202 are disposed as a radiated shape. The second electrode 30 surrounds the first electrode 20. FIG. 2B shows a top view of a light-emitting device 2' in accordance with another embodiment. The structure of the light-emitting device 2' in FIG. 2B is similar to that of the light-emitting device 2 described in FIG. 2A. As shown in FIG. 2B, the light-emitting device 2' includes three second pads 301a, 301b and 301c disposed on the p-type semiconductor layer 16 and adjacent to each vertex 60 of the triangular shape. That is, each of the first extending electrodes 202 respectively extends to the second pads 301a-301c adjacent to the vertexes 60a-60c. The gap D1 between the edge of the second extending electrode 302 and the edge of the p-type semiconductor layer 16 is preferably not greater than 100 µm so that the current can be spread via the transparent conductive layer 18 to the edge of the p-type semiconductor layer 16. The distance D2 between an end portion of the first extending electrode 202 and the edge of the adjacent second pad 301b is about 80 µm to 150 µm. And the distances D3 between the end portion of the first extending electrode 202 and edges of the two adjacent second extending electrodes 302 are substantially the same. In detail, the shortest distance D3 between the end portion of the first extending electrode 202 and edges of the adjacent second extending electrode 302 is about 60 µm to 120 µm. FIG. 2C shows a top view of a light-emitting device 2" in accordance with another embodiment. The cross-sectional structure of the light-emitting device 2" in FIG. 2C is similar to that of the light-emitting device 1 described in FIGS. 1A-1B. Referring to FIG. 2C, the first extending electrodes 202 extend form the first pad 201 and stretch toward the sides 80a~80c of the triangular shape from the top view. The first extending electrodes 202 respectively extend toward the sides 80a, 80b, and 80c along a direction perpendicular to the second extending electrode 302 on the each side 80a-80c. However, in the embodiments described above, the light-emitting device 2" includes two or three second pads 301 respectively adjacent to the vertexes 60 of the triangular shape can also be applied.

Figure 3A:
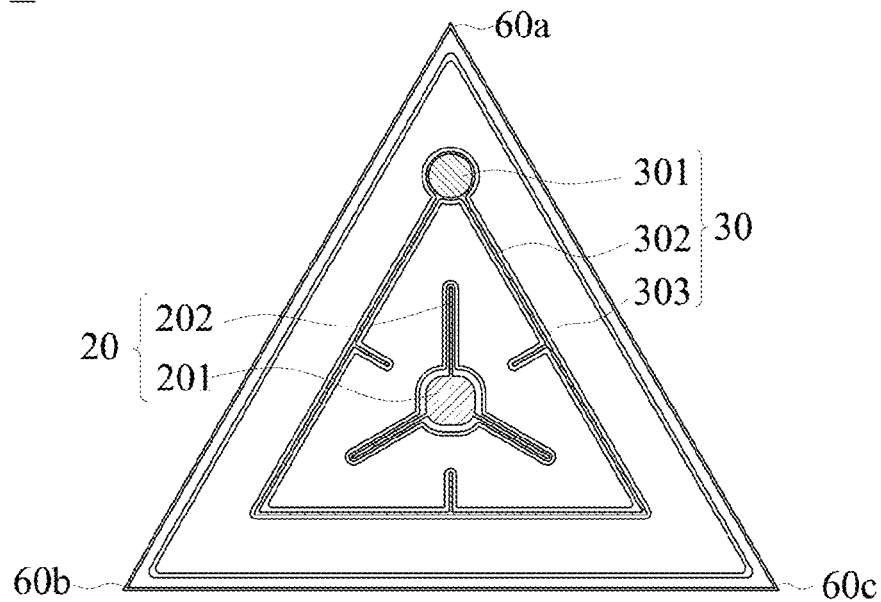
FIGS. 3A-3C are top views of light-emitting devices in accordance with another embodiments of present disclosure.
Figure 3B:
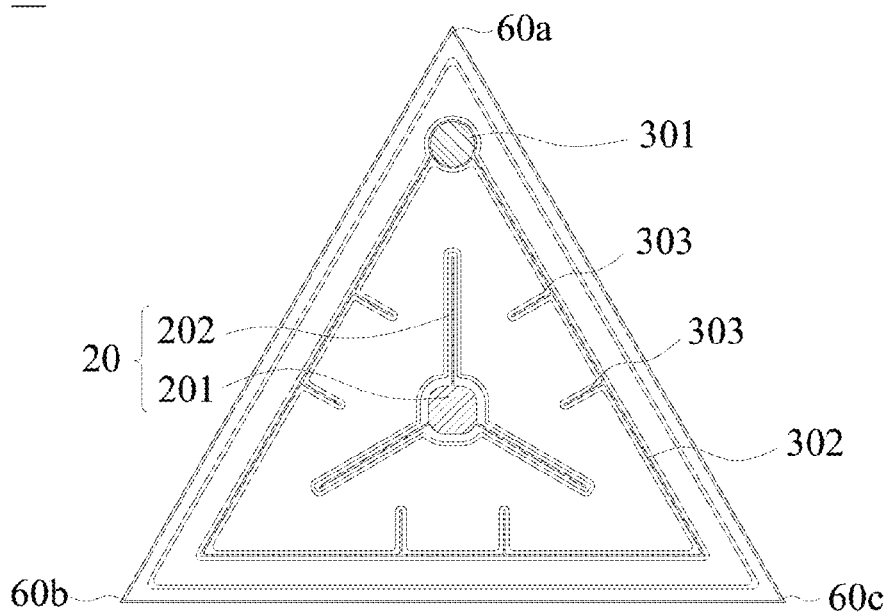
Figure 3C:
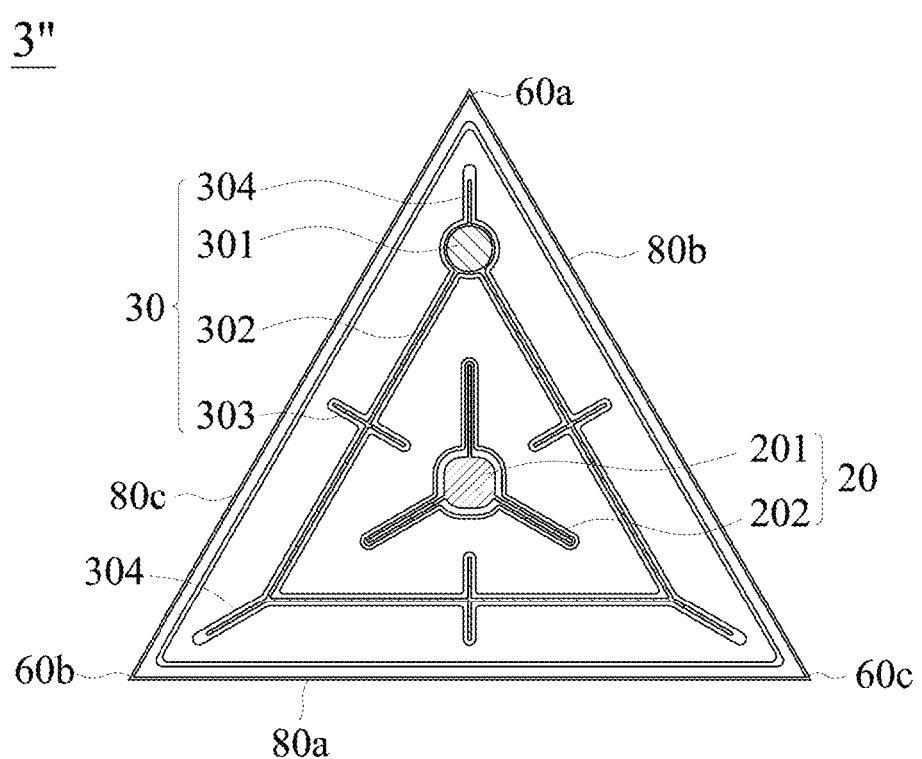
Figure 6:
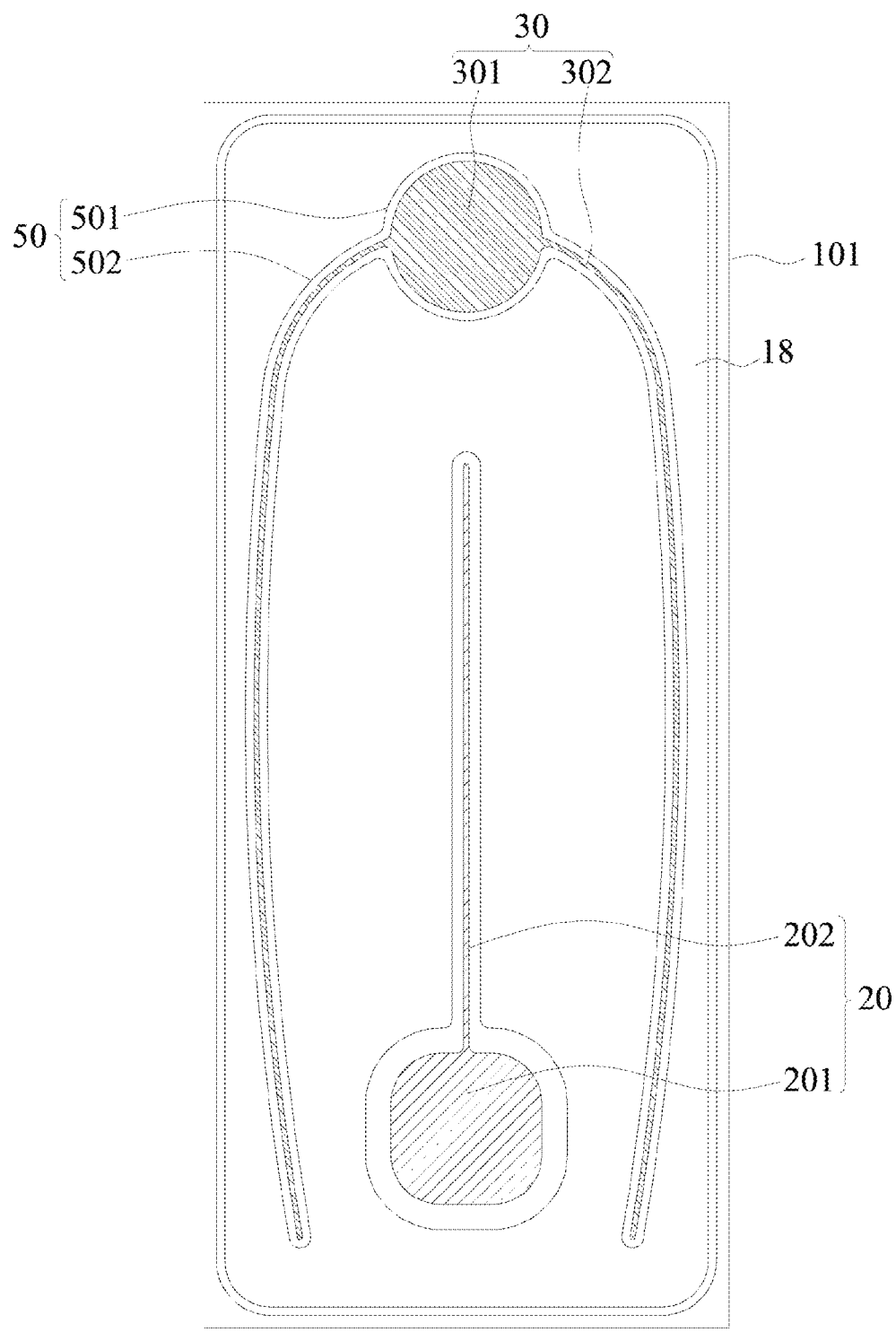
FIG. 6 is a top view of a conventional light-emitting device.

FIGS. 3A~3C respectively show top views of light-emitting devices 3, 3' and 3" in accordance with other embodiments. The structures of the light-emitting devices 3, 3' and 3" in FIGS. 3A~3C are similar to the structures described in FIGS. 2A and 2B, the difference is that in FIG. 3A~FIG. 3C, the second extending electrode 302 further includes a plurality of first branches 303 extending toward the central area of the triangular shape. Referring to FIG. 3A, each first branch 303 substantially extends from the middle point of the second extending electrode 302 on each side to the first pad 201. Each first branch 303 is located between any two adjacent first extending electrodes 202. Referring to FIG. 3B, the plurality of first branches 303 extend from the second extending electrode 302 toward the central area of the triangular shape. The first branches 303 are located between each two of the first extending electrodes 202. In FIG. 3C, the light-emitting device 3" further includes a plurality of second branches 304 near the vertexes and protruding from the second electrode 30. The second branches 304 extend from bending portions of the second extending electrode 302 and/or the second pads 301 and stretch toward each vertex 60. The first branches 303 extend from the second extending electrode 302 and stretch toward the central area and the sides 80a-80c of the triangular shape. In the embodiment, the end point of the first branch 303 is located beyond or on a line that is defined by linking two end points of two adjacent first extending electrodes 202. In detail, the first branches 303 and the first extending electrodes 202 are alternately arranged. In one embodiment, the length of the first branches 303 in the light-emitting devices as described in FIG. 3A~3C can be longer so as to be interdigitated with the first extending electrodes 202. In detail, the first branch 303 extends across the line that is defined by linking two end points of two adjacent first extending electrodes 202 and overlaps with the two adjacent first extending electrodes 202. Since the first extending electrodes 202 of the first electrode 20 and the first branches 303 of the second electrode 30 can be alternately arranged or interdigitate with each other, current crowding is reduced and current spreading is more uniform so as to improve luminous efficiency of the light-emitting devices 3, 3' and 3". However, in these embodiments, the number of the second pads is not limited to one. Three or two second pads located adjacent to the vertexes can also be applied. In an experiment to measure the performance improved in the light-emitting devices as shown in FIGS. 3A-3C, compared with a conventional rectangular LED having the same area as shown in FIG. 6, the light-emitting device 3 having an electrode layout as FIG. 3A has 0.07V decreased in forward voltage (Vf), 2.26% improvement in brightness without encapsulating glue and 1.17% improvement in brightness with encapsulating glue. The light-emitting device 3' having an electrode layout as FIG. 3B has 0.09V decreased in Vf, 2.05% improvement in brightness without encapsulating glue and 1.26% improvement in brightness with encapsulating glue. The light-emitting device 3" having an electrode layout as FIG. 3C has 0.08V decreased in Vf, 2.79% improvement in brightness without encapsulating glue and 1.45% improvement in brightness with encapsulating glue. In the embodiments, the thickness of the substrate 101 of the light-emitting devices is 150 µm.

Figure 4A:
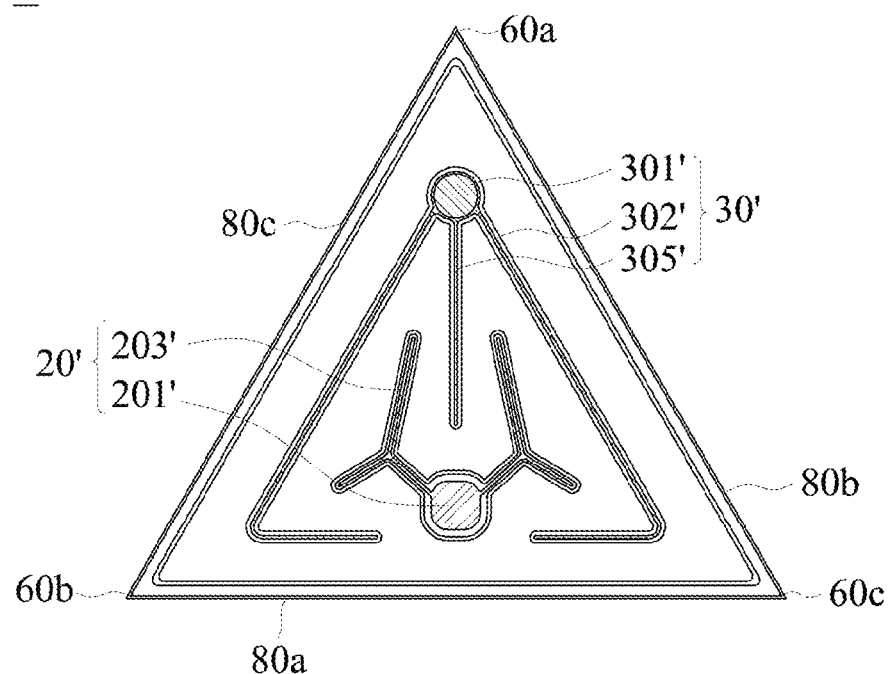
FIGS. 4A-4B are top views of light-emitting devices in accordance with another embodiments of present disclosure.
Figure 4B:
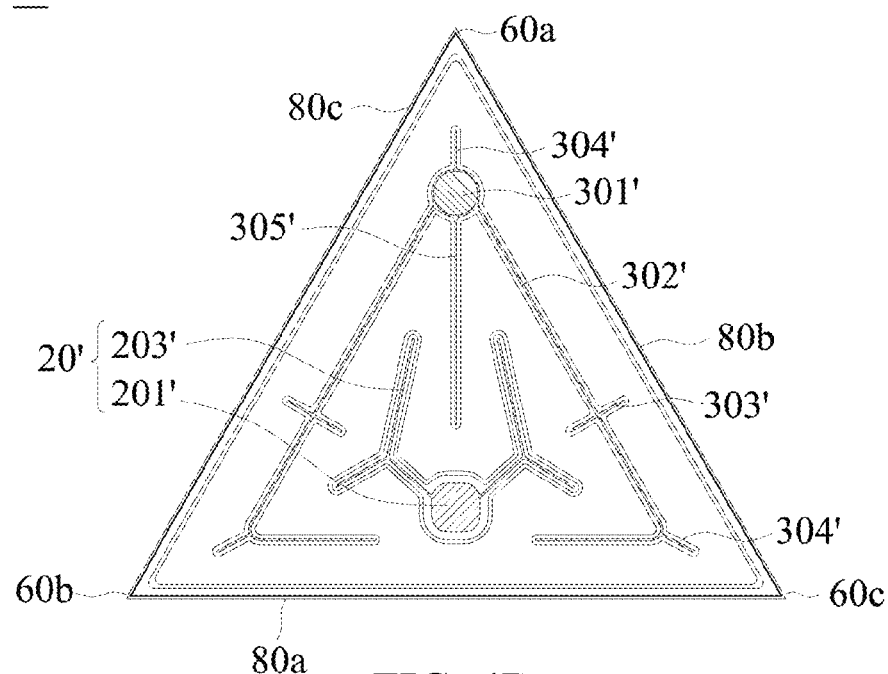

FIG. 4A and FIG. 4B respectively show top views of light-emitting devices 4 and 4' in accordance with other embodiments. Compared with the embodiments described above, a first pad 201' in FIGS. 4A and 4B is closer to the first side 80a of the triangular shape so that the first pad 201' is not entirely enclosed by second extending electrodes 302' from a top view. To be more specific, the first pad 201' has a side surface facing the first side 80a not surrounded by the second extending electrodes 302'. A second electrode 30' includes a second pad 301' near the first vertex 60a, the second extending electrodes 302' and a third extending electrode 305' extend from the second pad 301'. The side 80a is opposite to the vertex 60a. The second extending electrode 302' extends along the sides 80b, 80c of the triangular shape and stops at the first side 80a to form an open portion, so that the first pad 201' is not entirely enclosed by the second extending electrode 302'. A peripheral area of the triangular shape which is out of the second electrode 30' and not surrounded by the second electrode 30' has no any first electrode 20' formed thereon. In detail, the peripheral area is between the second electrodes 30' and the sides of the triangular shape. The first electrode 20' further includes Y-shaped branches 203' extending from the first pad 201'. The first pad 201' and the Y-shaped branches 203' are all located in the inscribed circle of the triangular shape. The third extending electrode 305' stretches to the first pad 201' and is set between and interdigitates with the two Y-shaped branches 203'. Any one of the second extending electrode 302' and the third extending electrode 305' surround one Y-shaped branch 203'. Therefore, current is more easily and more uniformly to flow to the first electrode 20'. In the light-emitting device 4' shown in FIG. 4B, a plurality of first branches 303' extend from the second extending electrodes 302' and a plurality of second branches 304' extend from the second pad 301' and from the bending portions of the second extending electrodes 302'. In one embodiment, the first branch 303' has a longer length so as to be arranged within an area between two tips of the Y-shaped branch 203'. The Y-shaped branches 203', the third extending electrode 305' and the first branches 303' can be alternately arranged or interdigitate with each other. Therefore, current spreading is more uniform so as to improve luminous efficiency of the light-emitting devices 4 and 4'. In an experiment to measure the performance improved in the light-emitting devices as shown in FIGS. 4A and 4B, compared with a rectangular LED having the same area as shown in FIG. 6, the light-emitting device 4 having an electrode layout as FIG. 4A has 0.09V decreased in forward voltage (Vf), 2.47% improvement in brightness without encapsulating glue and 1.79% improvement in brightness with encapsulating glue. The light-emitting device 4' having an electrode layout as FIG. 4B has 0.1V decreased in Vf, 2.23% improvement in brightness without encapsulating glue and 1.77% improvement in brightness with encapsulating glue.

Figure 5A:
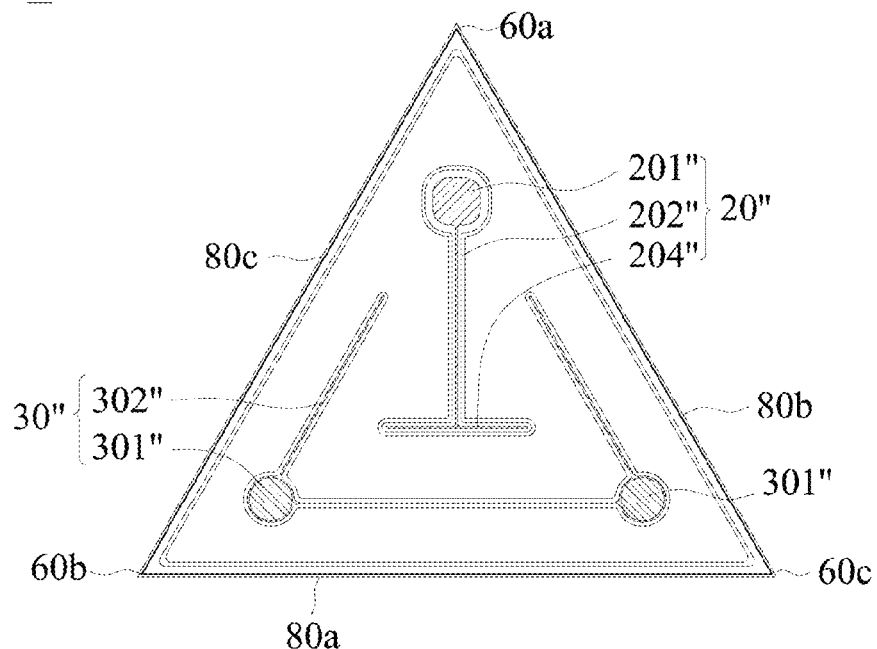
FIG. 5A-5C are top views of light-emitting devices in accordance with another embodiment of present disclosure.
Figure 5B:
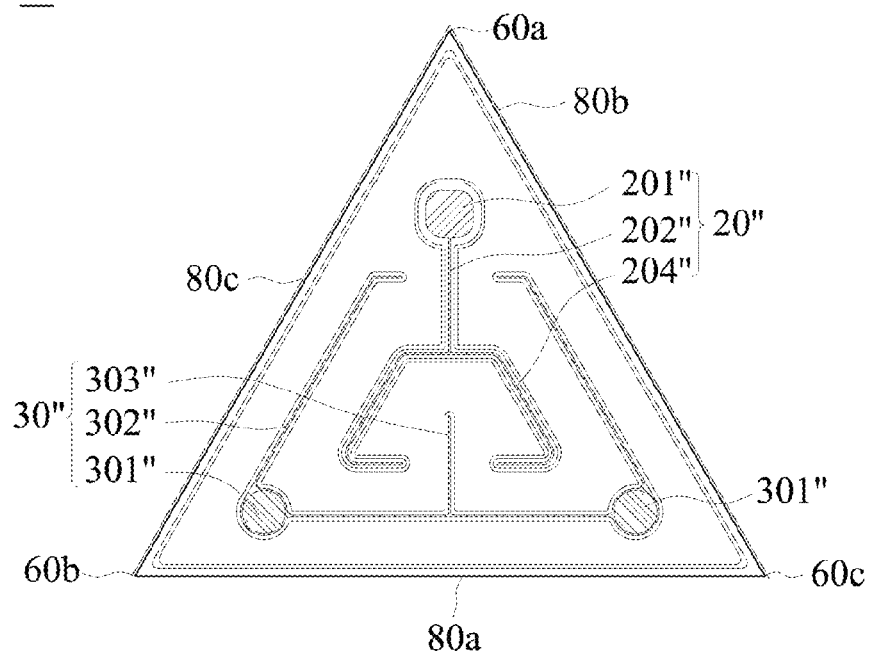
Figure 5C:
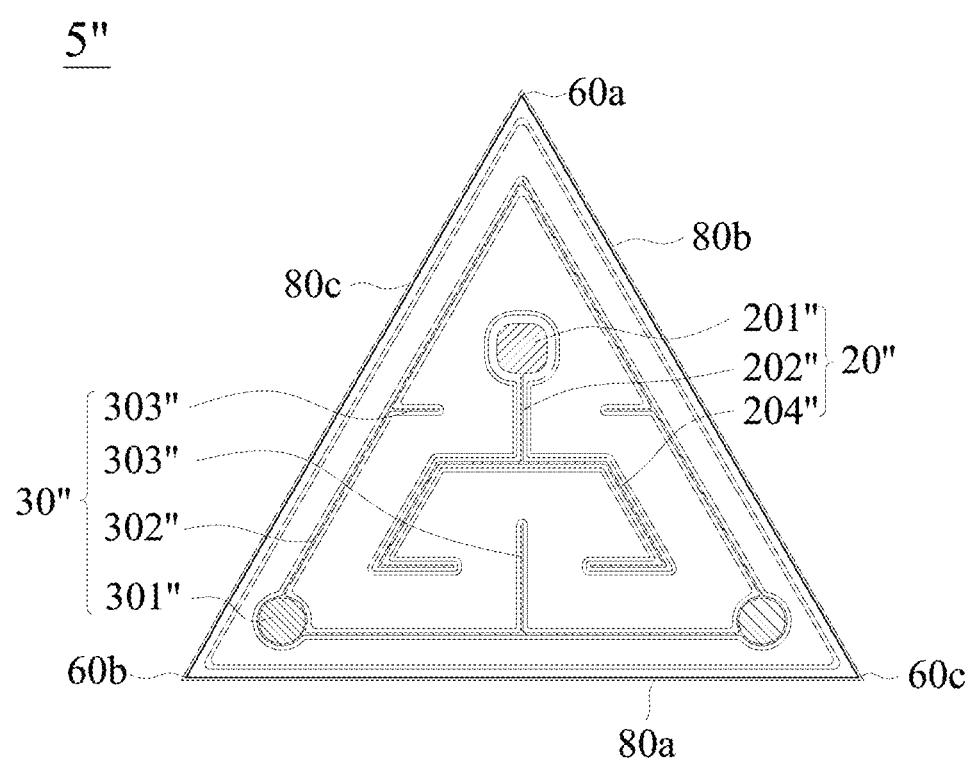

FIGS. 5A~5C respectively show top views of light-emitting devices 5, 5' and 5" in accordance with other embodiments. Compared with the embodiments described above, each of the first pad 201" in FIGS. 5A-5C is disposed adjacent to the first vertex 60a of the triangular shape. Two second pads 301" are disposed adjacent to other vertexes 60b and 60c of the triangular shape. A first extending electrode 202" extends from the first pad 201" and toward along a direction which is perpendicular to the side 80a and divides into two branches 204". Second extending electrodes 302" are disposed along the sides 80a, 80b, 80c of the triangular shape thereby to surround the first extending electrode 202" and the branches 204". In FIGS. 5B and 5C, the second extending electrodes 302" further includes one or a plurality of branches 303". The branches 204" of the first electrode 20" and the branches 303" of the second electrode 30" interdigitate with each other. In FIG. 5C, the second extending electrode 302" forms a closed loop to enclose the first pad 201", the first extending electrode 202" and the branches 204".

Table 1 shows an experimental comparison between the conventional light-emitting device and the light-emitting devices in accordance with the embodiments.

TABLE 1

| Example | Shape | Electrode | Substrate thickness (μm) | Vf (V) | Brightness improving ratio | Luminous Efficiency improving ratio |
|---|---|---|---|---|---|---|
| 1 | rectangular | 1 p-pad/ 1 n-pad | 150 | 3.08 | ref | ref |
| 2 | triangular | 1 p-pad/ 1 n-pad | 150 | 3.03 | 2.43% | 4.15% |
| 3 | triangular | 2 p-pads/ 1 n-pad | 150 | 2.99 | 1.71% | 4.75% |
| 4 | triangular | 1 p-pad/ 1 n-pad | 250 | 3.03 | 5.20% | 6.94% |
| 5 | triangular | 2 p-pads/ 1 n-pad | 250 | 3 | 3.49% | 6.23% |

Example 1 is the conventional rectangular light-emitting device as shown in FIG. 6. The chip shape and electrode layout of Example 1 is different from that of Examples 2-5, but the cross-section structure of Example 1 is the same as the structures of Examples 2-5 described in FIG. 1B. The rectangular area of Example 1 is the same as the triangular area of Examples 2~5 which is $6.629 \times 10^5$ μm². The electrode layouts in Example 2 and Example 4 are identical with that in FIG. 2A, and wherein the electrode layouts of Example 3 and Example 5 are similar to that of Examples 2 and 4 that further include one more second pad 301 adjacent to the vertex 60b or 60c of the triangular shape. The luminous efficiency is calculated by output power(mW)/input power(W) based on the light-emitting devices without encapsulating glue. As shown in the table, the brightness and the luminous efficiency in Examples 2~5 are higher than that of the conventional rectangular light-emitting device, and the forward voltage Vf are reduced in the triangular light-emitting devices. Moreover, in Examples 1~3 which have the same substrate thickness, the triangular light-emitting device with a plurality of second pad 301 as Example 3 has a lower forward voltage Vf and a higher luminous efficiency. In the triangular light-emitting devices with a thicker substrate as Example 4 and Example 5, the luminous efficiency is increased more than 6%. That is, light can be extracted from the lateral sides of the thicker substrate and light extraction is more effective in the triangle light-emitting device with the thicker substrate. Therefore, according to the embodiments of the application, the light-emitting device that has high brightness, luminous efficiency and better current spreading can be realized.

Figure 7A:
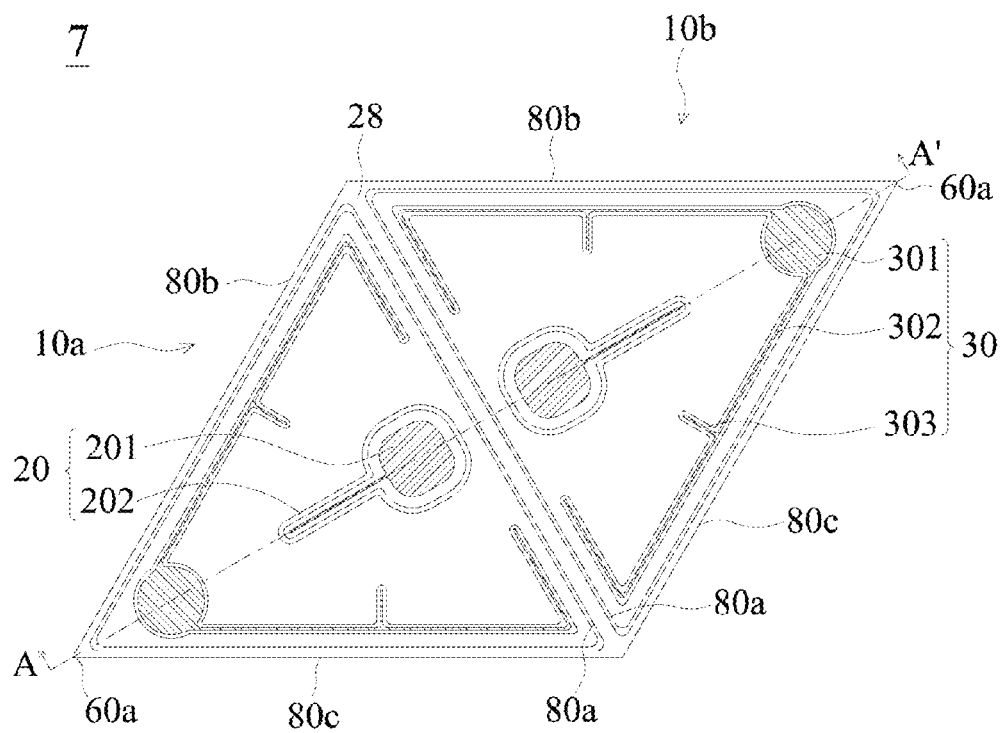
FIG. 7A is a top view of a light-emitting device in accordance with another embodiment of present disclosure.
Figure 7B:
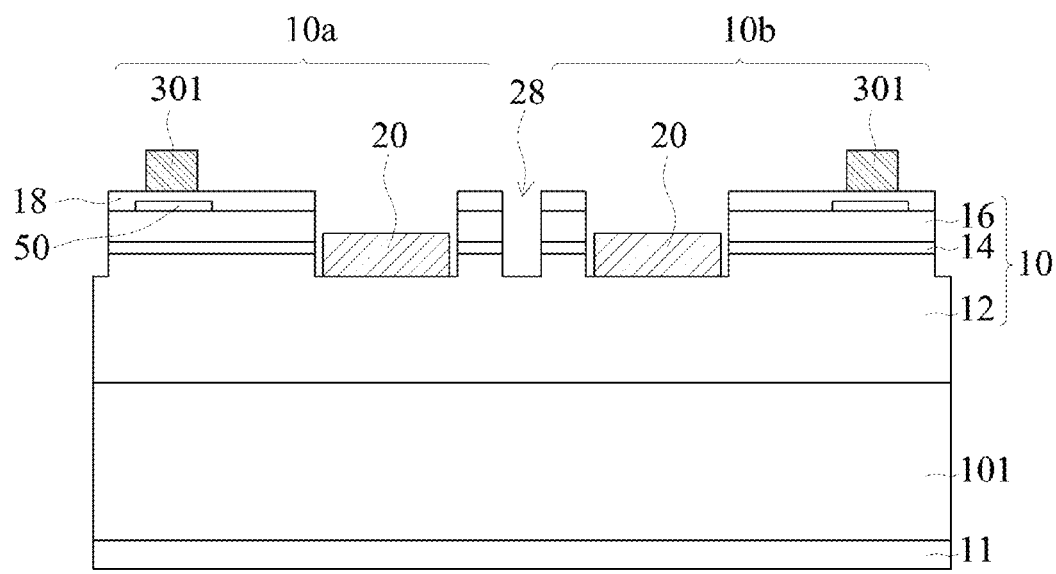
FIG. 7B is a cross-sectional view of a light-emitting device disclosed in FIG. 7A.

FIG. 7A shows a top view of a light-emitting device 7 in accordance with another embodiment. FIG. 7B shows a cross-sectional view taken along A-A' line of the light-emitting device 7 in FIG. 7A. As shown in FIGS. 7A and 7B, the light-emitting device 7 includes a substrate 101 with a rhombus shape and a light-emitting stack 10 formed thereon. The light-emitting stack 10 includes a first conductivity type semiconductor layer 12 for example an n-type semiconductor layer 12, an active layer 14, and a second conductivity type semiconductor layer 16 for example a p-type semiconductor layer 16 sequentially formed on one side of the substrate 101. A trench 28 is formed in the light-emitting stack 10 by removing a portion of the p-type semiconductor layer 16 and the active layer 14 to expose a surface of the n-type semiconductor layer 12. Thus, the trench 28 divides the active layer 14, and the p-type semiconductor layer 16 of the light-emitting stack 10 into two light-emitting units 10a and 10b. In the embodiment, the n-type semiconductor layer 12 is continuous and not divided by the trench 28. In another word, the two light-emitting units 10a and 10b share the common n-type semiconductor layer 12. In another embodiment, the n-type semiconductor layer 12 can be divided by the trench 28. Each light-emitting unit 10a, 10b has its own n-type semiconductor layer 12. Both the two units 10a and 10b have triangular upper surfaces and a first sides 80a neighboring each other. In this embodiment, the triangular upper surfaces are regular triangles, and the two light-emitting units 10a and 10b have the same shape, the same area and the same electrode layout. In each unit, the first electrode 20 having a first pad 201 and a first extending electrode 202 formed on the n-type semiconductor 12. The first pad 201 is disposed near the first side 80a and the first extending electrode 202 extends therefrom and toward a first vertex 60a opposite to the first side 80a. A second electrode 30 is formed on the second conductivity type semiconductor 16. The second electrode 30 includes a second pad 301 near the first vertex 60a and second extending electrodes 302 extend from the second pad 301. The second extending electrodes 302 are disposed along two sides 80b and 80c of the triangular shape and stops at the first sides 80a so as to surrounds the first electrode 20. The first pads 201 and the second pads 301 are located on a diagonal line of the rhombus shape. Branches 303 protrude from the second extending electrode 302 and extend toward the central area of each triangular shape. The two units are symmetric with each other and the axis of symmetry is the trench 28.

Figure 7C:
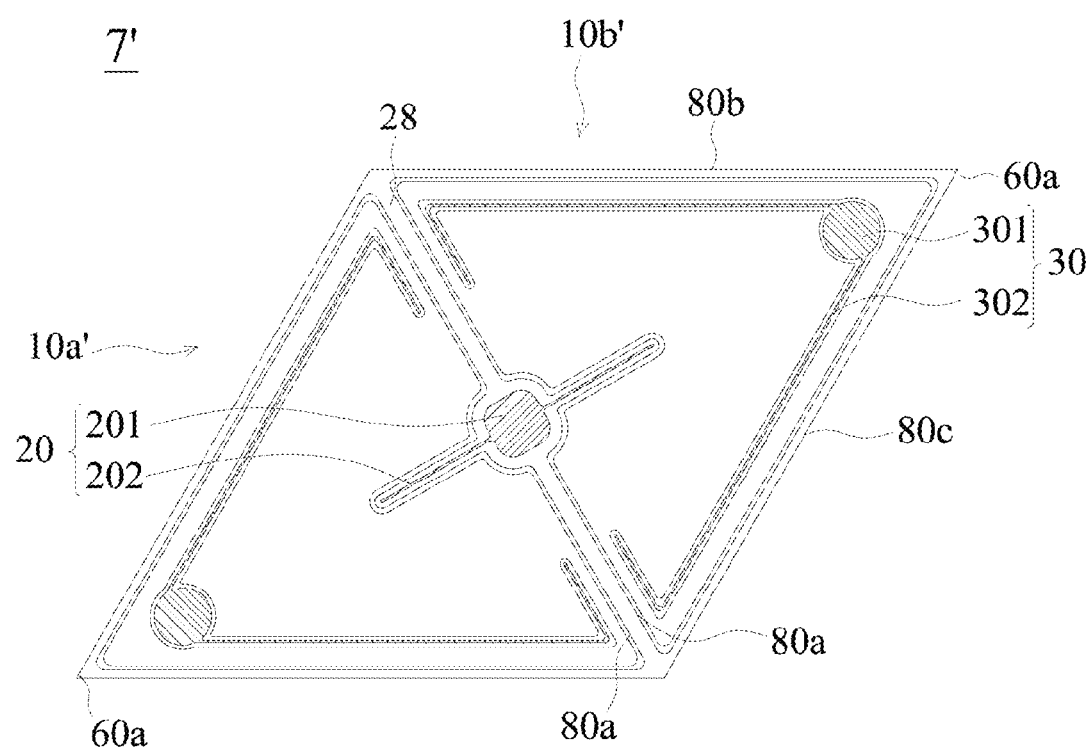
FIG. 7C is a top view of a light-emitting device in accordance with another embodiment of present disclosure.

FIG. 7C shows a top view of a light-emitting device 7' in accordance with another embodiment. The cross-sectional structure of the light-emitting device 7' is similar with the structure as described in FIGS. 7A and 7B, but the difference is that in FIG. 7C, a first pad 201 is formed on the first conductivity type semiconductor 12 in a trench 28. Then, two first extending electrodes 202 extend from the first pad 201 and respectively toward two first vertexes 60a of the two triangular light-emitting units 10a' and 10b'. The first pad 201 is substantially located at the center of the rhombus shape. Being similar with the light-emitting device 7 described in FIG. 7A, second extending electrodes 302 in FIG. 7C is disposed along two sides 80b and 80c of the triangular shape to surrounds the first extending electrodes 202. According to the rhombus light-emitting devices 7 and 7' in the embodiments, the light-emitting stack is divided into the two triangular light-emitting units 10a~10b and 10a'~10b'. As incorporated with the electrode layout described above, current injects into the light-emitting device via the two second pads 301 on the two vertexes of the rhombus shape and can quickly and uniformly conduct in the light-emitting region of the two triangular light-emitting units. From the top view of the light-emitting device 7 or 7', the first electrode 20 is surrounded by the second electrode 30, so that current flows into the first electrode 20 by various directions. As a result, light-emitting efficiency of the light-emitting device 7 and 7' can be improved.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:
1. A light-emitting element, comprising:
   a substrate;
   a first light-emitting stack formed on the substrate, comprising
      a triangular upper surface parallel to the substrate, having three sides and three vertexes;
   a first electrode formed on the first light-emitting stack and located near a first side of the three sides of the triangular upper surface; and
   a second electrode formed on the first light-emitting stack; comprising
      a second electrode pad near a first vertex of the three vertexes; and
      a second electrode extending part extending from the second electrode pad in two directions, disposed along other two sides of the three sides to surround the first electrode and stopping at the first side to form an opening.
2. The light-emitting element of claim 1, wherein the first electrode is located within an inscribed circle of the triangular upper surface.
3. The light-emitting element of claim 2, wherein the first electrode comprises a first electrode pad and a first electrode extending part extending from the first electrode pad, and the first electrode pad and the first electrode extending part are both located within the inscribed circle.
4. The light-emitting element of claim 1, wherein:
   the first electrode comprises a first electrode pad and a first electrode extending part extending from the first electrode pad; and
   the second electrode extending part comprises a branch protruding therefrom and toward the first electrode, and the first electrode extending part and the branch are alternately arranged or interdigitate with each other.
5. The light-emitting element of claim 4, wherein the branch is substantially perpendicular to the second electrode extending part from which the branch protrudes.
6. The light-emitting element of claim 1, wherein the second electrode extending part comprises a first branch protruding from a bending portion of the second electrode extending part and toward one of the other two vertexes.
7. The light-emitting element of claim 6, wherein the second electrode pad comprises a second branch protruding from the second electrode pad and toward the first vertex.
8. The light-emitting element of claim 1, wherein the first side is opposite to the first vertex and the opening is near the first side.
9. The light-emitting element of claim 1, wherein the triangular upper surface has a peripheral area not surrounded by the second electrode is devoid of the first electrode.
10. The light-emitting element of claim 1, wherein the first light-emitting stack comprises:
    a first semiconductor layer;
    a second semiconductor layer; and
    an active layer formed between the first and the second semiconductor layers;
   wherein the first electrode is formed on the first semiconductor layer, and the second electrode is formed on the second semiconductor layer.
11. The light-emitting element of claim 10, further comprising a second light-emitting stack formed on the substrate and having a triangular upper surface same as the first light-emitting stack; wherein the substrate comprises a rhombus shape upper surface and wherein the first semiconductor layers of the first and the second light-emitting stacks connect with each other to form a plane.
12. The light-emitting element of claim 11, wherein the first electrode is substantially located at a center of the rhombus shape from a top view.
13. The light-emitting element of claim 11, wherein the first light-emitting stack has a first electrode layout formed thereon, the second light-emitting stack has a second electrode layout formed thereon, and the first electrode layout and the second electrode layout are the same and symmetric with each other.
14. A light-emitting element, comprising:
    a substrate;
    a light-emitting stack formed on the substrate, comprising
       a triangular upper surface parallel to the substrate, having three sides and three vertexes;
    a first electrode formed on the light-emitting stack and located within an inscribed circle of the triangular upper surface; and
    a second electrode formed on the light-emitting stack; comprising
       a second electrode pad near a first vertex of the three vertexes;
       a second electrode extending part extending from the second electrode pad, disposed along the three sides and having a closed loop to enclose the first electrode therein.

15. The light-emitting element of claim 14, wherein the second electrode comprises a third electrode pad near one of the other two vertexes.

16. The light-emitting element of claim 14, wherein the first electrode comprising a first electrode pad and a plurality of first electrode extending part extending from the first electrode pad.

17. The light-emitting element of claim 16, wherein a plurality of first electrode extending part respectively extends toward the three vertexes.

18. The light-emitting element of claim 16, wherein the second electrode extending part comprises a branch protruding therefrom and toward the first electrode, and the first electrode extending part and the branch are alternately arranged or interdigitate with each other.

19. The light-emitting element of claim 14, wherein the second electrode extending part comprises a first branch protruding from a bending portion of the second electrode extending part and toward one of the other two vertexes.

20. The light-emitting element of claim 14, wherein the second electrode pad comprises a second branch protruding from the second electrode pad and toward the first vertex.

* * * * *